United States Patent [19]

Minogue

[11] Patent Number: 5,731,940
[45] Date of Patent: Mar. 24, 1998

[54] ESD PROTECTION SCHEME

[75] Inventor: Paschal Minogue, Tipperary, Ireland

[73] Assignee: Analog Devices, Inc., Norwood, Mass.

[21] Appl. No.: 494,167

[22] Filed: Jun. 23, 1995

[51] Int. Cl.$^6$ ........................ H02H 9/00
[52] U.S. Cl. ........................ 361/56; 361/111
[58] Field of Search ............ 361/56, 91, 111, 361/54

[56] References Cited

U.S. PATENT DOCUMENTS

| | | | |
|---|---|---|---|
| 4,829,350 | 5/1989 | Miller | 357/23.13 |
| 4,839,768 | 6/1989 | Daniele et al. | 361/56 |
| 4,855,620 | 8/1989 | Duvvury et al. | 307/448 |
| 4,896,243 | 1/1990 | Chatterjee et al. | 361/91 |
| 5,442,217 | 8/1995 | Mimoto | 361/111 |
| 5,477,414 | 12/1995 | Li et al. | 361/56 |

*Primary Examiner*—Jeffrey A. Gaffin
*Assistant Examiner*—Sally C. Medley
*Attorney, Agent, or Firm*—Wolf, Greenfield & Sacks, P.C.

[57] ABSTRACT

An apparatus and a method for providing ESD protection in integrated circuits is provided. The apparatus includes ESD protection circuits between interface pins and a substrate of the integrated circuit to discharge ESD current at one interface pin of the integrated circuit through the substrate to an ESD reference point at another interface pin. The ESD protection circuits include reverse breakdown devices that become conductive when a reverse breakdown threshold level is exceeded. The method includes discharging electrostatic charge from a first interface pin of the integrated circuit to a second interface pin through a substrate of the integrated circuit.

4 Claims, 4 Drawing Sheets

ESD PROTECTION SCHEME

BACKGROUND OF THE INVENTION

1. Field of the Invention

The present invention relates generally to electrostatic discharge protection, and more particularly, to a method and apparatus for protecting integrated circuits from electrostatic discharge.

2. Discussion of the Related Art

Electrostatic discharge or ESD is a well-known cause of failure for integrated circuits. The build up of electrostatic charge on personnel and equipment during the manufacture and use of integrated circuits may assume potentials as high as 30,000 volts with respect to an ESD potential reference point. The built-up charge may be discharged to the reference point through an integrated circuit when either the personnel or the equipment comes in contact with the integrated circuit and, in particular, in contact with the conductive connection pins of the integrated circuit. The electrostatic discharge may occur during manufacturing or testing when the integrated circuit is not operating, or it may occur when the integrated circuit is installed in a device and is operating. Integrated circuits are particularly susceptible to ESD damage during handling in a manufacturing or testing environment.

ESD protection has been incorporated in integrated circuits of the prior art. FIG. 1 shows a representative ESD protection scheme in an integrated circuit 10 of the prior art. In FIG. 1, circuitry connected to the input pins DI/Px, AIO/Py and output pins DO/Px of the integrated circuit are protected against occurance of an ESD event having a positive polarity with respect to either power pins DVDDx and AVDDy or ground pins DGNDX and AGNDy by using diodes 12, 14, 16, 18, 24 and 26. Diodes 16, 18 and 26 are configured to conduct in a reverse breakdown mode during an ESD event, and diodes 12, 14, and 24 are configured to conduct in a forward mode during an ESD event.

The protection scheme of FIG. 1 is shown implemented in an integrated circuit 10 having both digital and analog circuits each on its own substrate. The integrated circuit 10 includes interface pins DVDDx, AVDDy, DI/Px, DO/Px, DGNDx, AIO/Py and AGNDy for respectively a digital power supply, an analog power supply, a digital input, a digital output, a digital ground, an analog input/output, and an analog ground. In FIG. 1 the analog input/output pin AIO/Py is representative of either an analog input pin or an analog output pin. Integrated circuit 10 also includes a pin connected to an analog substrate ASUB for analog circuitry and a pin connected to a digital substrate DSUB for digital circuitry. An integrated circuit utilizing the protection scheme of the prior art may actually include several additional input, output, power and ground pins.

In the prior art protection scheme shown in FIG. 1, the digital input pin DI/Px and the digital output pin DO/Px are provided with ESD protection consisting of diodes 12, 14, 16 and 18 connected between the pins and the digital power pin DVDDx and the digital ground pin DGNDx. Each analog input and output pin AIO/Py is similarly protected using diodes 24 and 26 connected between the input and output pins and the analog power pin AVDDy and the analog ground AGNDy. The digital ground pin DGNDx is referenced to the digital substrate DSUB using a pair of diodes 20 and 22 connected opposite and in parallel such the anode of one diode 20 and the cathode of the other diode 22 are connected to the digital ground pin DGNDx, and the cathode of one diode 20 and the anode of the other diode 22 are connected to the digital substrate DSUB. The analog ground pin AGNDy is referenced to the analog substrate ASUB in a similar manner using diodes 28 and 30 connected opposite and in parallel between the analog ground pin AGNDy and the analog substrate ASUB. Resistor 35 represents the resistance in the integrated circuit between the analog and digital substrates.

In addition to providing protection against large ESD potentials between inputs and their associated power supplies and grounds, protection between supplies and grounds is achieved in the illustrated prior art using "cross protection" circuits (P) 32 and 34 configured in a "diagonal" scheme. The cross protection circuits include a P-type protection circuit 32 having an input 32A connected to the digital power pin DVDDx and an output 32B connected to the analog ground pin AGNDy and a second P-type protection circuit 34 having an output 34B connected to the digital ground pin DGNDx and having an input 34A connected to the analog power supply pin AVDDy.

FIG. 2 provides a schematic diagram of the cross protection circuit 32, it being understood that the circuit 34 is identical to circuit 32. As shown in FIG. 2, the protection circuit 32 includes a diode 36 having an anode 36A connected to the output 32B of the protection circuit and a cathode 36B connected to the input 32A of the protection circuit. The protection circuit 32 also includes an "off" NMOS transistor 38 having a gate G, a drain D, and a source S. A resistor 42 is connected between gate G and output 32B of the protection circuit. The drain D is connected to the input 32A of the protection circuit. The source S is connected to the output 32B.

In the protection scheme of the prior art, each of the diodes has a reverse breakdown threshold level, above which it breaks down and conducts current. When an ESD event occurs, for example at the digital input pin DI/Px having a positive polarity with respect to the digital ground pin DGNDx, an ESD potential is developed from the digital input pin to the digital ground pin. If the ESD potential exceeds the reverse breakdown threshold level of the diode 16, then the diode will break down and dissipate the electrostatic charge to reduce the potential and protect the integrated circuit 10. An electrostatic current through the diode 16, from the cathode to the anode, dissipates the electrostatic charge.

The "off" NMOS device 38 in the protection circuits 32 and 34 similarly breaks down during an ESD event to discharge ESD current from one power supply to the ground of the other power supply. The "off" NMOS device is used because it has a lower breakdown voltage than the reverse breakdown of a diode, and therefore offers improved protection of the internal circuitry over the use of a diode.

The ESD protection scheme of the prior art described above becomes cumbersome and expensive for integrated circuits having a high number of supply pins and ground pins. Further, in order to be effective, the ESD scheme of the prior art requires a low impedance connection between the reverse breakdown protection device and the ESD potential reference point. In the discussion provided above, the protection devices are described as being coupled between pins of the integrated circuit. Typically, the protection devices are not connected directly at the pin, but rather through some length of power and ground conductive paths in the integrated circuit. The impedances of these paths must be kept low in order for the protection devices to be effective.

SUMMARY OF THE INVENTION

According to one aspect of the present invention, an integrated circuit is provided with ESD protection. The integrated circuit comprises a first set of interface pins, a first substrate, and a first set of ESD protection circuits having at least one signal input or output pin. The ESD protection circuits are coupled between the first set of interface pins and the first substrate to conduct electrostatic charge between an interface pin and the substrate.

In another embodiment of the present invention, the integrated circuit further includes a second set of interface pins, a second substrate, a second set of ESD protection circuits coupled between the second set of interface pins and the second substrate, and first and second substrate ESD protection circuits. The substrate ESD protection circuits allow for the discharge of electrostatic charge between the first substrate and the second substrate.

In a preferred embodiment, each of the ESD protection circuits of the first and the second sets of ESD protection circuits includes a reverse breakdown device that conducts electrostatic charge through the ESD protection circuit in a first direction when a first potential across the device is exceeded and conducts electrostatic charge through the protection device in a second direction when a second voltage threshold across the device is exceeded.

According to another aspect of the present invention, a method is provided for protecting an integrated circuit, having at least first and second interface pins and a first substrate, from electrostatic discharge to the first interface pin with respect to the second interface pin, the first interface pin being a signal input or signal output pin. The method includes steps of conducting ESD charge from the first interface pin to the first substrate, and conducting the ESD charge from the substrate to the second interface pin.

DESCRIPTION OF THE FIGURES

For a better understanding of the present invention, reference is made to the drawings which are incorporated herein by reference and in which.

DETAILED DESCRIPTION

Figure 3:
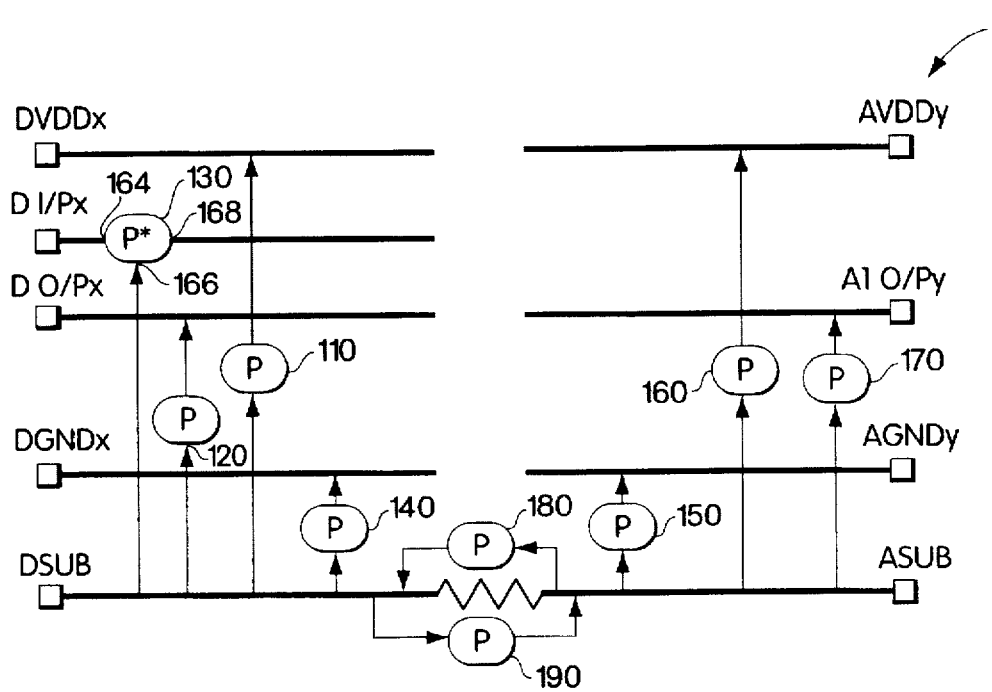
FIG. 3 is a schematic diagram of an integrated circuit having ESD protection in accordance with one embodiment of the present invention.

FIG. 3 shows an integrated circuit 100 comprising an ESD protection scheme in accordance with one embodiment of the present invention. The integrated circuit 100 of FIG. 3 has the same pin designations as the prior art circuit of FIG. 1. In the embodiment shown in FIG. 3, an ESD protection circuit is provided between each pin of the integrated circuit and either the digital substrate DSUB or the analog substrate ASUB.

Each of the digital power supply pin DVDDx, the digital output pin DO/Px and the digital ground pin DGNDx is connected to an input of a corresponding reverse breakdown protection circuit 110, 120 and 140 respectively. Protection circuits 110, 120, and 140 are identical and are termed P-type protection circuits herein. The output of P-type protection circuits 110, 120, and 140 is connected to the digital substrate DSUB. The digital input pin DI/Px is connected to an input 164 of a different type of protection circuit, termed a P*-type protection circuit 130. A flint output 166 of the P*-type protection circuit is connected to the digital substrate DSUB. A second output 168 of the P*-type protection circuit is connected to the digital input of the integrated circuit 100.

Each of the analog power supply pin AVDDy, the analog ground pin AGNDy, and the analog input/output pin AIO/Py is connected to an input of a P-type protection circuit 160, 150, and 170 respectively. The output of each of the P-type protection circuits 150, 160, and 170 is connected to the analog substrate ASUB.

The digital substrate and the analog substrate are referenced to each other using a pair of P-type protection circuits 180, 190. One protection circuit 180 of the pair of P-type protection circuits has an output connected to ASUB and an input connected to DSUB. The other P-type protection circuit 190 of the pair of P-type protection circuits has an input connected to ASUB and an output connected to DSUB.

Figure 2:
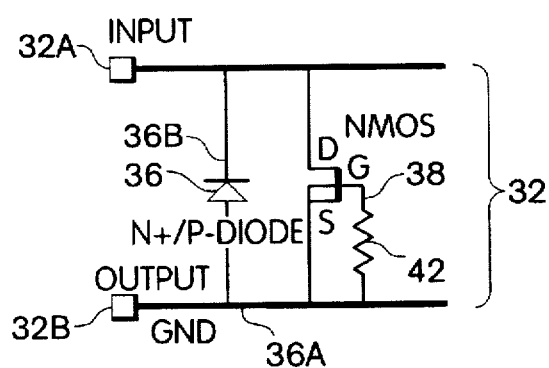
FIG. 2 is a schematic diagram of an ESD protection circuit used in an integrated circuit of the prior art.
Figure 4:
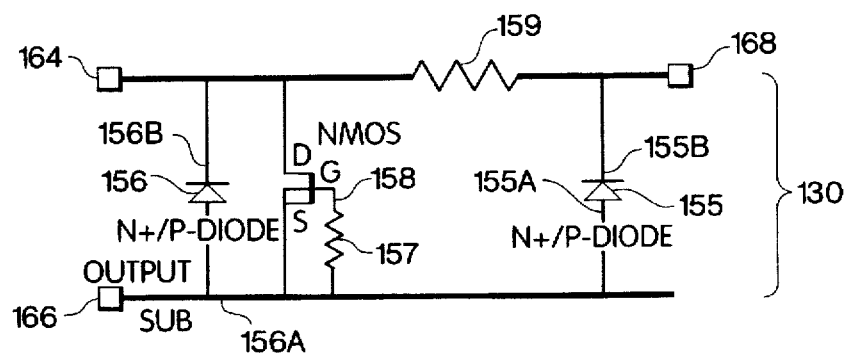
FIG. 4 is a schematic diagram of an ESD protection circuit used in the embodiment of the invention shown in FIG. 3.

Each of the P-type protection circuits 110, 120, 140, 150, 160, 170, 180 and 190 shown in FIG. 3 is identical to the protection circuit 32 shown in FIG. 2. A schematic diagram of the P*-type protection circuit 130 is shown in FIG. 4. As shown in FIG. 4, the P*-type protection circuit includes a diode 156 having an anode 156A connected to a first output 166 of the P*-type protection circuit, and a cathode 156B connected to the input 164 of the P*-type protection circuit. The P*-type protection circuit 130 also includes an "off" NMOS transistor 158, a resistor 157, a resistor 159, and a diode 155. The transistor 158 has a drain D, a gate G, and a source S. Resistor 157 is connected between the gate G of the transistor 158 and the first output 166 of the P*-type protection circuit. The source S of the transistor 158 is connected to the first output 166 of the protection circuit, and the drain D of the transistor is connected to the input 164 of the protection circuit. Resistor 159 is connected between the input 164 and the second output 168 of the P*-type protection circuit. Diode 155 has an anode 155A connected to the output 166 of the P*-type protection circuit and a cathode 155B connected to the second output 168 of the P*-type protection circuit.

In the P-type and P*-type protection circuits described above, the NMOS transistors 38 and 158 are minimum gate length devices to provide for early snapback and have n-wells in the "hot" diffusions to provide robustness. The diodes 36, 156 and 155 are "spot" diodes.

The operation of the ESD protection scheme of the embodiment of the invention shown in FIG. 3 will now be described. When an ESD event occurs at the digital output pin DO/Px having a positive polarity with respect to the digital ground pin DGNDx, the P-type protection circuit 120 will exhibit reverse breakdown and conduct electrostatic charge to the digital substrate DSUB. The diode 136 in protection circuit 140 will be forward biased and conduct the electrostatic charge from the digital substrate DSUB to the reference point for the ESD discharge, the digital ground pin DGNDx.

The P*-type protection circuit 130 operates in a similar manner when an ESD event occurs at the digital input DI/Px with respect to the digital ground DGNDx. The additional resistor 159 and the diode 155 in the P*-type protection circuit provide additional protection for the integrated circuit by providing a higher impedance input.

When an ESD event occurs at either the digital input pin DI/Px or the digital output pin DO/Px having a positive polarity with reference to the digital supply voltage pin DVDDx, the protection scheme operates in a manner similar to that described above, except that diode 36 in protection circuit 110 will be forward biased to conduct the electrostatic charge to the ESD reference point, rather than the diode of protection circuit 140. The P-type protection circuits 150, 160 and 170 operate in a similar manner to protect the input/output analog pins AIO/Py.

The P-type protection circuits 180, 190, connected between the substrates DSUB and ASUB, allow electrostatic charge to flow between the substrates when an ESD event occurs at either one of the digital pins having a positive polarity with respect to one of the analog pins, or when an ESD event occurs at one of the analog pins having a positive polarity with respect to one of the digital pins.

Figure 5B:
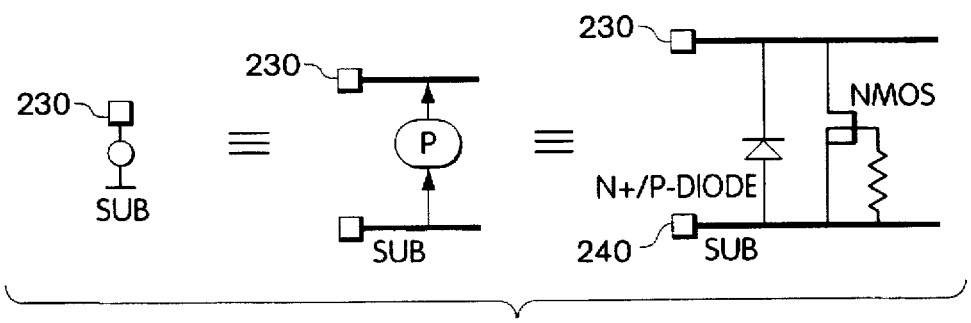
FIG. 5B is a schematic diagram of an ESD protection circuit used in the embodiment of the invention shown in FIG. 5A.
Figure 5A:
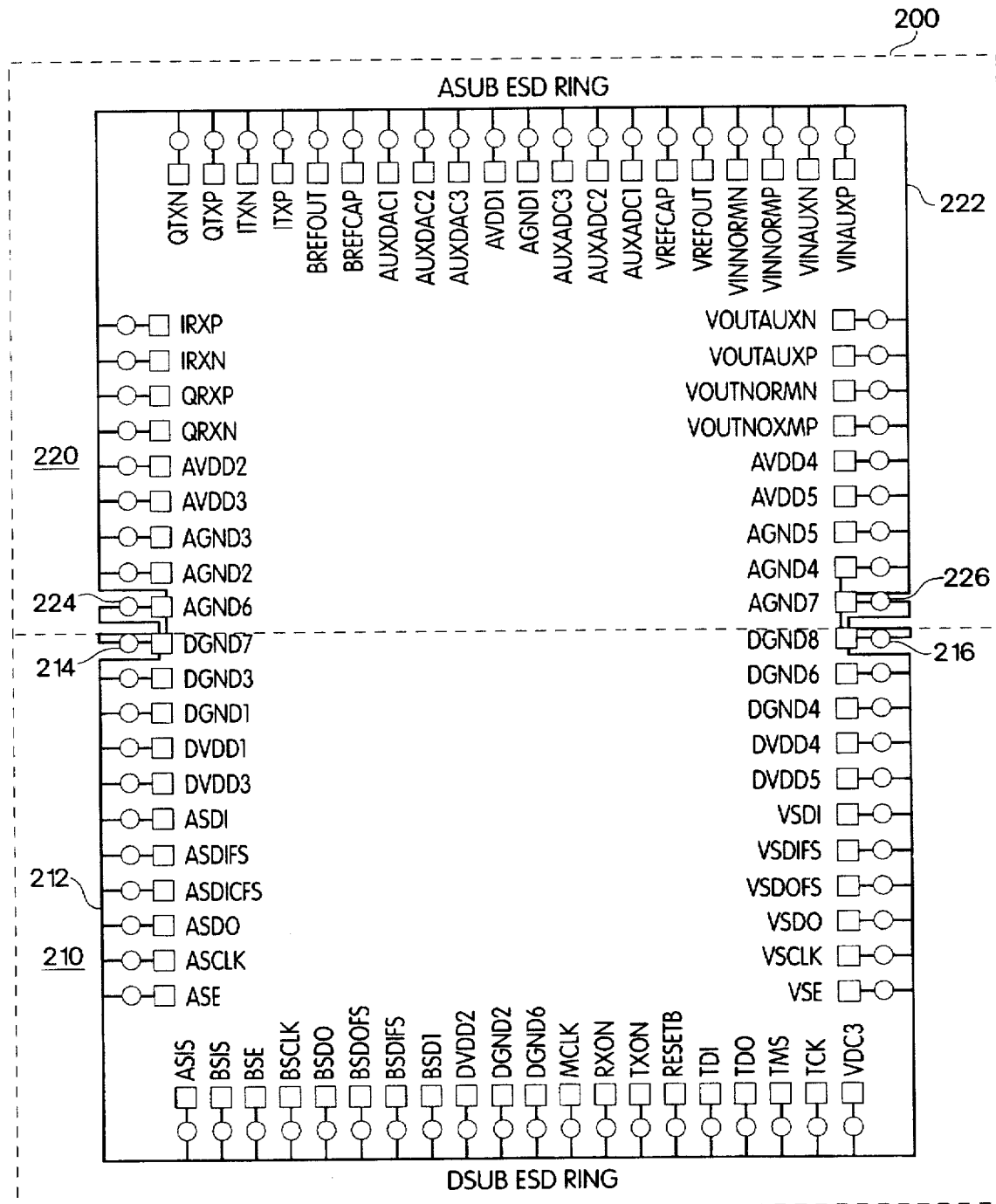
FIG. 5A shows an ESD protection map of an integrated circuit having ESD protection in accordance with another embodiment of the present invention.

In a second embodiment of the invention, all of the protection circuits of FIG. 3 may be a P-type protection circuit. In this embodiment, the P*-type protection circuit 130 of FIG. 3 is replaced with a P-type protection circuit shown in FIG. 2. FIG. 5A shows an ESD protection map of an integrated circuit 200 according to the second embodiment of the present invention. The integrated circuit is comprised of an analog section 220 and a digital section 210. As shown in FIGS. 5A and FIG. 5B, each of the input pins 230 is connected to either the analog substrate 222 or the digital substrate 212 through a P-type protection circuit. The P-type protection circuit used in the device 200 of FIG. 5A, and shown in FIG. 5B, is the protection device previously described with reference to FIG. 2 and operates in the same manner.

As shown in FIG. 5A, the digital substrate 212 is connected to the analog substrate 220 using four P-type protection circuits 214, 216, 224 and 226. FIG. 5A illustrates that each P-type protection circuit is located at a pin, and is connected between the pin and one of the digital substrate and the analog substrate.

Figure 1:
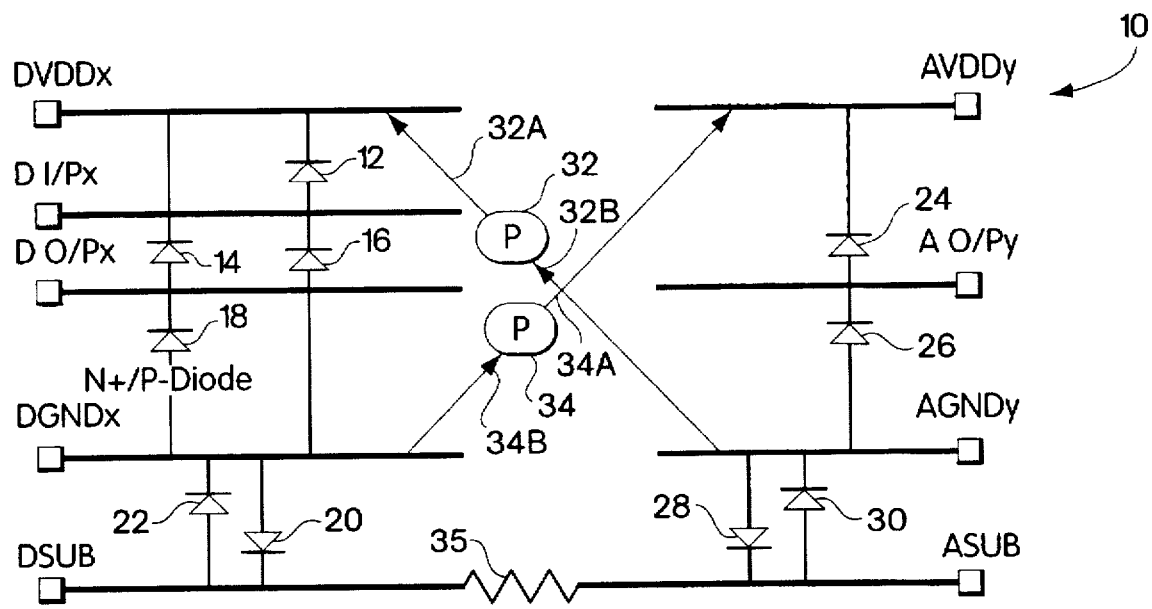
FIG. 1 is a schematic diagram of an integrated circuit of the prior art having ESD protection.

The embodiments of the invention described above have several advantages over the prior art of FIG. 1. In that prior art, the diagonal protection circuits are provided between each input power and ground connection, requiring a large number of protection circuits as the number of power and ground pins increases. In the embodiments of the invention described above, connection between all the power and ground pins of separate supplies is achieved through the protection circuits connecting the digital and analog substrates. Separate protection circuits between supplies are not needed on each input power and ground pin, thereby lowering the total number of protection circuits needed in an integrated circuit.

Further, in the embodiments of the invention described above, the protection circuits are located directly at the pins and an ESD current path is through the protection devices and the substrates, rather than through ground and power conductors as in the prior art. This results in a lower impedance connection between a reverse breakdown device and a reference point of an ESD event, making the reverse breakdown device more effective. The impedance of the substrates will be particularly low when the substrates are formed using epitaxial layers.

Figure 6:
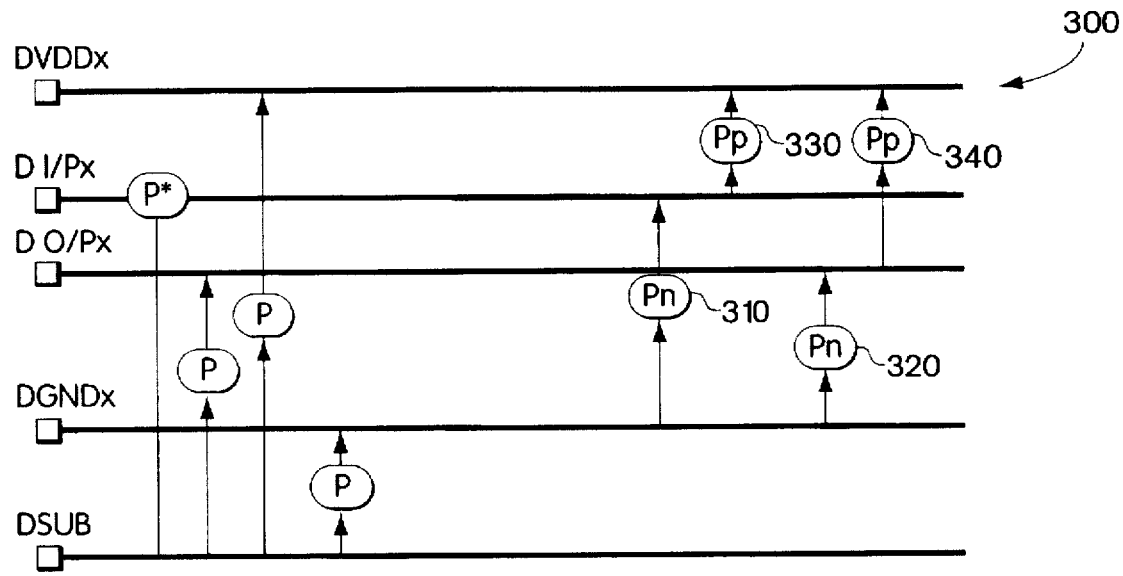
FIG. 6 is a schematic diagram of an integrated circuit of another embodiment of the present invention in which supplementary ESD protection is used.

In a third embodiment of the present invention, supplementary ESD protection, in addition to the ESD protection provided in either the first embodiment or the second embodiment, is provided at each digital input/output. FIG. 6 shows supplementary ESD protection incorporated in an integrated circuit 300 along with the ESD scheme of the digital interface pins of the first embodiment of the present invention. The supplementary protection consists of a Pn-type protection circuit 310 connected between the digital input pin DI/Px and the digital ground pin DGNDx, a Pn-type protection circuit 320 connected between the digital output pin DO/Px and the digital ground pin DGNDx, a Pp-type protection circuit 340 connected between the digital supply pin DVDDx and the digital output pin DO/Px, and a Pp-type protection circuit 330 connected between the digital supply pin DVDDx and the digital input pin DI/Px.

Figure 7:
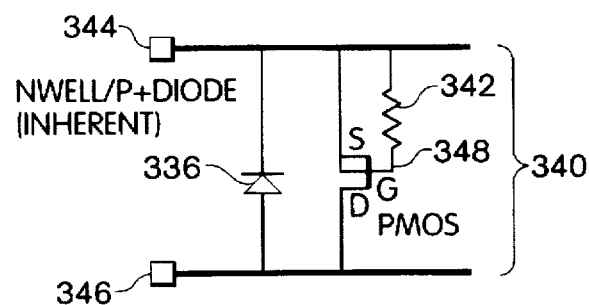
FIG. 7 is a schematic diagram of an ESD protection circuit used in the embodiment of the invention shown in FIG. 6.

FIG. 7 provides a schematic diagram of the Pp-type protection circuit 340, it being understood that the Pp-type protection circuit 330 is identical to circuit 340. As shown in FIG. 7 the Pp-type protection circuit 340 consists of a PMOS transistor 348 and a resistor 342. In FIG. 7 a diode 336 is shown connected between the input 344 and the output 346 of the Pp-type protection circuit. The diode 336 is an inherent diode in the PMOS transistor. The PMOS transistor 348 has a gate G, a drain D and a source S. The resistor 342 is connected between the gate of the transistor and the input 344 of the Pp-type protection device. The source S of the transistor is connected to the input of the Pp-type protection circuit, and the drain D of the transistor is connected to the output 346 of the protection circuit.

Figure 8:
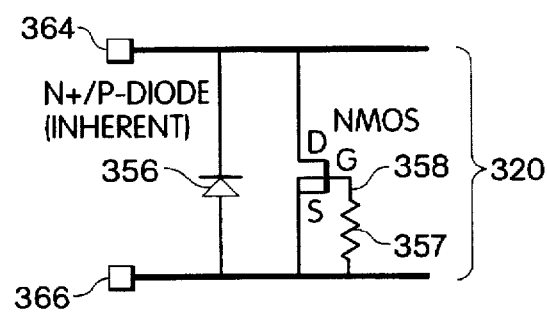
FIG. 8 is a schematic diagram of another ESD protection circuit used in the embodiment of the invention shown in FIG. 6.

FIG. 8 provides a schematic diagram of the Pn-type protection circuit 320, it being understood that the Pn-type protection circuit 310 is identical to circuit 320. The Pn-type protection circuit 320 consists of an NMOS transistor 358 having a drain D, a gate G and a source S, and a resistor 357. The resistor 357 is connected between the gate of the NMOS transistor and the output 366 of the protection circuit. The drain D of the NMOS transistor is connected to the input 364 of the protection circuit, and the source S is connected to the output 366 of the protection circuit. The diode 356, connected between output 366 and input 364 is an inherent diode in the NMOS transistor.

The Pp-type protection circuits and the Pn-type protection circuits operate in a manner similar to the protection circuits previously disclosed. Each of the transistors 348 and 358, as well as the inherent diodes 336 and 356, exhibits reverse breakdown when an ESD event occurs at the input having a positive polarity with respect to the output to conduct the electrostatic charge through the device, rather than through the integrated circuit, to protect the integrated circuit. The supplementary protection provides additional protection on the digital inputs and outputs by providing just one reverse breakdown device in the ESD current path, rather than one reverse breakdown device plus a forward diode drop as in the first and second embodiments of the present invention.

Having thus described illustrative embodiments of the invention, there are alterations, modifications and improvements that would readily occur to those skilled in the art. Such alterations, modifications and improvements are intended to be within the scope and spirit of the invention.

Accordingly, the foregoing description is by way of example only and not intended as limiting. The invention is limited only as defined in the following claims and the equivalents thereto.

What is claimed is:

1. An integrated circuit having ESD protection for protecting the integrated circuit from an electrostatic discharge, the integrated circuit comprising:

a first substrate;

a second substrate;

a plurality of interface pins including a first set of interface pins having at least one signal input or output pin, and a second set of interface pins;

a first set of ESD protection circuits, each of the ESD protection circuits of the first set having an input coupled to one of the interface pins of the first set and having an output coupled to the first substrate so that an electrostatic discharge to one of the interface pins of the first set will be discharged to the first substrate;

a second set of ESD protection circuits, each of the ESD protection circuits of the second set having an input coupled to one of the interface pins of the second set and having an output coupled to the second substrate so that an electrostatic discharge to one of the interface pins of the second set will be discharged to the second substrate;

a first substrate ESD protection circuit having an input coupled to the first substrate and an output coupled to the second substrate; and a second substrate ESD protection circuit having an input coupled to the second substrate and an output coupled to the first substrate;

wherein the first set of interface pins includes digital pins including a digital power supply pin, a digital ground pin, a digital input pin and a digital output pin, the first substrate is a digital substrate, the second set of interface pins includes analog pins including an analog power supply pin, an analog ground pin, an analog input pin and an analog output pin, and the second substrate is an analog substrate;

wherein each of the ESD protection circuits of the first set and the second set, the first substrate ESD protection circuit, and the second substrate ESD protection circuit include:

a resistor having a first terminal coupled to the output of the ESD protection circuit and a second terminal;

an NMOS transistor having a gate coupled to the second terminal of the resistor, a drain coupled to the input of the ESD protection circuit, and a source coupled to the output of the ESD protection circuit; and a diode having an anode coupled to the output of the ESD protection circuit and a cathode coupled to the input of the ESD protection circuit; and wherein one of the ESD protection circuits of the first set, coupled to the digital input pin, further includes:

a second output coupled to a digital input of the integrated circuit;

a second resistor coupled between the input of the protection device and the second output; and a second diode having an anode coupled to the output of the protection device and a cathode coupled to the second output of the protection device.

2. The integrated circuit of claim 1, further comprising:

a first supplemental ESD protection circuit having an input coupled to the digital input pin and an output coupled to the digital ground pin;

a second supplemental ESD protection device having an input coupled to the digital output pin and an output coupled to the digital ground pin;

a third supplemental ESD protection device having an output coupled to the digital input pin and an input coupled to the digital power supply pin; and a fourth supplemental ESD protection device having an output coupled to the digital output pin and an input coupled to the digital power supply pin.

3. The integrated circuit of claim 2, wherein the first and the second supplemental ESD protection circuits include:

a resistor having a first terminal coupled to the input of the ESD protection circuit and a second terminal; and a PMOS transistor having a gate coupled to the second terminal of the resistor, a source coupled to the input of the ESD protection circuit, and a drain coupled to the output of the ESD protection circuit.

4. The integrated circuit of claim 3, wherein the third and the fourth supplemental ESD protection circuits include:

a resistor having a first terminal coupled to the output of the ESD protection circuit and a second terminal; and an NMOS transistor having a gate coupled to the second terminal of the resistor, a drain coupled to the input of the ESD protection circuit, and a source coupled to the output of the ESD protection circuit.

* * * * *